US010424579B2

United States Patent
Scholz et al.

(10) Patent No.: US 10,424,579 B2
(45) Date of Patent: Sep. 24, 2019

(54) TUNABLE ELECTROSTATIC DISCHARGE CLAMP

(71) Applicant: IMEC vzw, Leuven (BE)

(72) Inventors: Mirko Scholz, Leuven (BE); Shih-Hung Chen, Heverlee (BE)

(73) Assignee: IMEC vzw, Leuven (BE)

( * ) Notice: Subject to any disclaimer, the term of this patent is extended or adjusted under 35 U.S.C. 154(b) by 76 days.

(21) Appl. No.: 15/857,022

(22) Filed: Dec. 28, 2017

(65) Prior Publication Data
US 2019/0206855 A1    Jul. 4, 2019

(51) Int. Cl.
| | |
|---|---|
| *H01L 29/08* | (2006.01) |
| *H01L 27/02* | (2006.01) |
| *H01L 29/10* | (2006.01) |
| *H02H 9/04* | (2006.01) |
| *H01L 29/735* | (2006.01) |

(52) U.S. Cl.
CPC ...... *H01L 27/0262* (2013.01); *H01L 29/0808* (2013.01); *H01L 29/0821* (2013.01); *H01L 29/1008* (2013.01); *H01L 29/1095* (2013.01); *H01L 29/735* (2013.01); *H02H 9/046* (2013.01)

(58) Field of Classification Search
CPC ............. H01L 29/1095; H01L 29/0808; H01L 29/0821; H01L 29/735; H01L 29/1008
See application file for complete search history.

(56) References Cited

U.S. PATENT DOCUMENTS

| | | | | |
|---|---|---|---|---|
| 7,605,431 | B2* | 10/2009 | Chen | ................... H01L 27/0259 257/370 |
| 2012/0170160 | A1* | 7/2012 | Wang | .................. H01L 27/0262 361/56 |
| 2013/0082353 | A1* | 4/2013 | Kuo | ..................... H01L 27/0259 257/591 |
| 2013/0279051 | A1* | 10/2013 | Gill | ........................ H02H 9/041 361/56 |
| 2014/0225158 | A1* | 8/2014 | Kuo | ........................ H01L 29/74 257/173 |
| 2014/0353799 | A1* | 12/2014 | Hwang | .................. H01L 29/732 257/577 |
| 2016/0056231 | A1* | 2/2016 | Singh | .................. H01L 29/0619 257/487 |
| 2018/0082994 | A1* | 3/2018 | Han | ........................ H01L 23/60 |
| 2019/0115340 | A1* | 4/2019 | Claes | .................. H01L 27/0277 |

* cited by examiner

*Primary Examiner* — Douglas M Menz
(74) *Attorney, Agent, or Firm* — Knobbe Martens Olson & Bear LLP

(57) ABSTRACT

A semiconductor device for electric discharge protection is disclosed. In one aspect, the semiconductor device includes a substrate having a p-type doping. The semiconductor device includes a first well and a second well having an n-type doping and arranged spaced apart within a surface layer of the substrate, and a third well having a p-type doping and arranged in the surface layer of the substrate between the first well and the second well. The semiconductor device further includes an emitter region and a base contact region having a p-type doping and arranged within a surface layer of the first well, and a collector region having a p-type doping. The collector region is arranged at least partly within a surface layer of the third well and such that it overlaps both of the first well and the second well. An integrated circuit including a semiconductor device is also provided.

20 Claims, 3 Drawing Sheets

TUNABLE ELECTROSTATIC DISCHARGE CLAMP

BACKGROUND

Technical Field

The disclosed technology relates to the field of electrostatic discharge protection. In particular, the disclosed technology relates to a semiconductor device for electrostatic discharge protection and an integrated circuit including such a semiconductor device.

Description of the Related Technology

Many system-on-chip (SoC) and system-in-package (SiP) designs are used, for example, in mobile applications. To further reduce the number of components on mobile application boards, several building blocks which were formerly independent integrated circuits (ICs) are now integrated in one die or IC package. A low-voltage, low-power radio frequency (RF) front-end may, for example, be integrated together with a high-voltage power management circuit for charging of a mobile phone battery.

Such a level of integration may introduce challenges for electric/electrostatic discharge (ESD) protection design, as high-voltage tolerant ESD protection solutions may need to be implemented using advanced low-voltage technologies. Such technologies may for example include complementary metal-oxide-semiconductor (CMOS) technologies.

Many developers are so called "fabless" developers, who design their devices themselves but outsource the actual fabrication of the devices to external manufacturers. Such fabless developers may, thus, be required to rely on a given foundry process, and there is therefore a need for a more flexible ESD protection design.

SUMMARY OF CERTAIN INVENTIVE ASPECTS

To at least partially fulfill the above needs, the disclosed technology seeks to provide an improved semiconductor device for electrostatic discharge (ESD) protection. To achieve this, a semiconductor device and an integrated circuit as defined in the independent claims are provided. Further embodiments of the disclosed technology are provided in the dependent claims.

According to a first aspect of the disclosed technology, a semiconductor device for electrostatic discharge protection is provided. The semiconductor device may include a substrate. The substrate may have a p-type doping. The semiconductor device may further include a first well and a second well. The first well and the second well may have an n-type doping. The first well and the second well may be arranged spaced apart within a surface layer of the substrate. The first well may be a base or base region. The semiconductor device may further include a third well having a p-type doping. The third well may be arranged between the first well and the second well. The third well may be arranged within the surface layer of the substrate.

The semiconductor device may include an emitter region. The emitter region may have a p-type doping. The emitter region may be arranged within a surface layer of the first well. The semiconductor device may include a base contact region. The base contact region may have an n-type doping. The base contact region may be arranged within the surface layer of the first well. The base contact region may contact the (base) first well. The semiconductor device may include a collector region. The collector region may have a p-type doping. The emitter region, the base contact region and the collector region may form part of a bipolar junction transistor (BJT). The collector region may be arranged at least partly within a surface layer of the third well. The collector region may be arranged such that it overlaps both of the first well and the second well.

The substrate may be a substrate of a semiconductor material. Herein, a "p-type doping" may mean that such a semiconductor material has been implanted with impurities which may provide additional holes, such that the majority carriers of current in the material are holes. Likewise, an "n-type doping" means that such a semiconductor material has been implanted with impurities which may provide additional electrons, such that the majority carriers of current in the material are electrons.

That some parts, like wells or regions, are arranged "spaced apart" may mean that the parts referred to do not physically overlap each other in space. That a region is "arranged in", e.g., a well may, for example, mean that the local properties of that well, in the area/volume defining the region, has been changed, for example by implanting of a different type of majority carriers, or by implanting of additional majority carriers of the same type as those already in the well.

The semiconductor device may function as an ESD protection clamp, wherein, during ESD stress, the device may operate as a silicon controlled rectifier (SCR). This may occur, e.g., due to the presence of a parasitic PNPN junction formed between the emitter region and the second well. The overlap of the collector region with the first well and the second well may move the breakdown location of this PNPN-junction from between one of the n-type wells and the third well to between one of the n-type wells and the collector region. More specifically, the "collector" of the BJT may be either one of the third well and the collector region, depending on, e.g., the overlap between the collector region and the first well. As will be described in more detail below, this provides a more tunable ESD protection device. If, for example, the overlap between the collector region and, e.g., the first well is sufficiently small, such that the third well acts as the "collector" of the BJT, the "collector region" may be understood as a collector contact region, contacting the third well (the collector). If, for example, the overlap between the collector region and, e.g., the first well is sufficiently large, such that the breakdown location of the PNPN-junction is between the first well and the collector region, the collector region may be the collector.

During normal operation, the SCR may be off (i.e., in a non-conducting state). Phrased differently, the substrate, the first well, the second well, the third well, the base contact region, the emitter region and the collector region may form part of a PNP with a parasitic SCR. During an ESD stress, the semiconductor device may operate as an SCR. The anode of this SCR may be formed by the emitter region and the base contact region contacting the first well (the base). The cathode of the SCR may be formed by the collector region and the second (n-type doped) well.

Both the trigger (or turn-on) voltage ($V_T$) and the holding voltage ($V_H$) for the device may be tuned by adjusting the overlap of the collector region with the n-type wells (i.e., the first well and the second well) and the length of the collector region (i.e., the length of the third, p-type, well). For example, reducing the finite overlap between the collector region and an n-type well (e.g., the first well) may increase the trigger voltage, and vice versa. As another example, increasing the length of the collector region may increase both the trigger voltage and the holding voltage. As a result, adjusting the overlap and/or the length of the collector region may adapt the device (the ESD clamp) to different design windows only by changing the layout of the device. By only changing the layout, and not, for example, the different types of doping used in the different regions, the device may be fabricated without changing the foundry process, which may avoid extensive costs and/or manufacturing complexity. Adjusting the overlap may allow one to tune the trigger voltage of the ESD clamp and to lower it to a safe level near a breakdown voltage of, for example, an internal circuit to which the ESD clamp may be connected.

In some embodiments, the emitter region, the base contact region and the collector region may be heavily doped regions. That something is "heavily doped" may mean that more of the majority carriers are available, and may be achieved, for example, by implanting a greater amount of impurities. Here, "more" may be in relation to the doping concentration(s) in for example the first well, the second well and/or the third well. Phrased differently, if a region located in a well is considered to be "heavily doped", it may be understood that the doping of the region is higher than the doping of the well in which the region is located, if the doping types in both the well and the region are the same (e.g., p-type or n-type). More generally, the exact doping levels, such as in "heavily" doped regions and also in other regions, as used herein, may be doping levels understood by the skilled person and as used in, e.g., a standardized CMOS process, as delivered, e.g., by a foundry. Such a process may be, for example, a 40 nm TSCM CMOS process. In addition, other such processes may be used to obtain the different regions, wells and corresponding doping types/levels as used herein.

In some embodiments, the semiconductor device may include a first connection. The first connection may electrically connect the emitter region and the base contact region of the BJT together. The semiconductor device may further include a second connection. The second connection may electrically connect the collector region and the second well together. Herein, a "connection" may be a low-resistive connection. Such a connection may for example include a metal line or similar. A connection may for example be formed in a back-end-of-line (BEOL) stage of production, and include for example copper damascene or similar.

In some embodiments, the first connection may include a biasing resistance. Herein, a "resistance" may be understood as something which provides more resistance (in terms of electric conductivity) than, e.g., a low-resistive connection. The biasing resistance may be arranged such that current which passes through the first connection may also pass through the biasing resistance (e.g., a series connection). For example, if the first connection is a metal line, part of this metal line may be replaced by the biasing resistance. The biasing resistance may control the amount of current flowing to/from the base (first well) via the base contact region. For example, the biasing resistance may be such that it keeps the PNP with the parasitic SCR in an off-state during normal operation of a circuit to which the semiconductor device (ESD clamp) is connected.

In some embodiments, the second connection may include (i.e., comprise a further connection to) an n-type region. The n-type region of the second connection may have a heavy n-type doping (i.e., be heavily doped). The n-type region of the second connection may be arranged within a surface layer of the second well.

In some embodiments, the BJT may be a first BJT. The semiconductor device may further include a second BJT. The second BJT may be formed in the substrate. The second BJT may be spaced apart from the first well, the second well, and the third well. A base of the BJT may have an n-type doping. The semiconductor device may further include a third connection. The third connection may electrically connect a collector of the second BJT and the emitter region of the first BJT together. The semiconductor device may further include a fourth connection. The fourth connection may electrically connect a base of the second BJT and an emitter of the second BJT together. The third connection and the fourth connection may be paths of low resistance, for example metallic lines or similar, as described earlier herein. The second BJT may be a PNP-type BJT.

The second BJT, which may be connected in series with the PNP with the parasitic SCR (i.e., the first BJT), may increase a trigger voltage of the ESD clamp. Also, the second BJT may increase a holding voltage of the ESD clamp.

In some embodiments, the fourth connection may include a biasing resistance. The biasing resistance of the fourth connection may, for example, control an amount of current flowing to/from the base of the second BJT. The biasing resistance of the fourth connection may, for example, keep the second BJT in an off-state during normal operation of the circuit to which the semiconductor device (ESD clamp) is connected.

In some embodiments, the second BJT may include a fourth well. The fourth well may have an n-type doping. The fourth well may be arranged spaced apart from the first well, the second well and the third well, within the surface layer of the substrate. The fourth well may be the base of the second BJT. The second BJT may further include a fifth well. The fifth well may have a p-type doping. The fifth well may be arranged within a surface layer of the fourth well. The fourth well may, for example, be a deep well. The fifth well may form part of an emitter of the second BJT. The second BJT may further include a base contact region. The base contact region may have an n-type doping. The base contact region may be arranged within the surface layer of the fourth well. The base contact region of the second BJT may contact the base (the fourth well) of the second BJT. The second BJT may further include a collector region. The collector region of the second BJT may have a p-type doping. The collector region may be arranged within the surface layer of the fourth well. The collector region, the base contact region, and the fifth well may be arranged spaced apart within the fourth well. The collector region may correspond to "the collector" of the second BJT. The second BJT may further include an emitter contact region. The emitter contact region may be arranged within a surface layer of the fifth well. The emitter contact region may have a p-type doping. The emitter contact region may contact the emitter (the fifth well) of the second BJT. In some embodiments, the base contact region, the collector region, and the emitter contact region, may be heavily doped regions.

The fifth well (i.e., the emitter well of the second BJT) may, for example, provide a further increased holding voltage. If the fifth well is not included, it may be assumed that the emitter contact region assumes the function of the emitter of the second BJT.

According to a second aspect of the disclosed technology, an integrated circuit is provided. The integrated circuit may include a semiconductor device as described herein with reference to the semiconductor device of the first aspect. The integrated circuit may further include a supply voltage or input/output terminal. A supply voltage terminal may, for example, be a terminal on which a finite voltage is applied in order to power the integrated circuit. An input/output terminal may for example be a terminal on which an input/output signal is provided to/from the integrated circuit. The integrated circuit may further include a reference voltage terminal. The reference voltage terminal may, for example, be connectable to a ground, and provide a return path for current entering the integrated circuit, for example, via the supply voltage terminal or the input/output terminal. The reference voltage terminal may be electrically connected to the collector region and the second well of the (first) BJT. The supply voltage or input/output terminal may be electrically connected to the emitter region of the (first) BJT, or, if the semiconductor device includes the second BJT as described above with reference to the semiconductor device according to the first aspect, the emitter (e.g., the emitter contact region) of the second BJT.

The disclosed technology relates to all possible combinations of features recited in the claims. Further, any embodiment described with reference to a semiconductor device according to the first aspect of the disclosed technology may be combinable with any one of the embodiments described with reference to the integrated circuit according to the second aspect of the disclosed technology, or vice versa.

Further objectives and advantages of the various embodiments of the disclosed technology will be described below by means of exemplifying embodiments.

BRIEF DESCRIPTION OF THE DRAWINGS

Exemplifying embodiments will be described below with reference to the accompanying drawings, in which.

Figure 1:
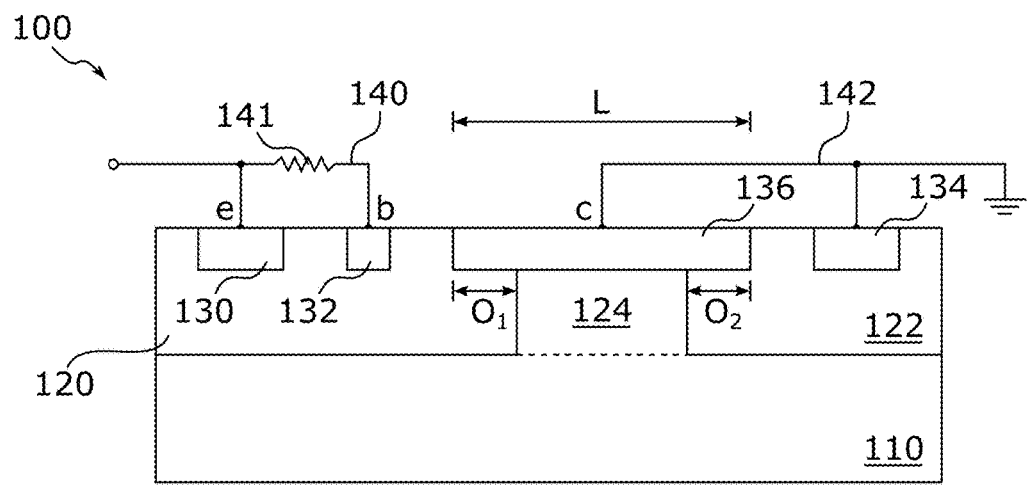
FIG. 1 illustrates schematically an embodiment of a semiconductor device according to the disclosed technology.

In the drawings, like reference numerals will be used for like elements unless stated otherwise. Unless explicitly stated to the contrary, the drawings show only such elements that are necessary to illustrate the example embodiments, while other elements, in the interest of clarity, may be omitted or merely suggested. As illustrated in the figures, the sizes of elements and regions may be exaggerated for illustrative purposes and, thus, are provided to illustrate the general structures of the embodiments.

DETAILED DESCRIPTION OF CERTAIN ILLUSTRATIVE EMBODIMENTS

Exemplary embodiments will now be described more fully hereinafter with reference to the accompanying drawings. The drawings show exemplary embodiments, but the invention may, however, be embodied in many different forms and should not be construed as limited to the embodiments set forth herein; rather, these embodiments are provided for thoroughness and completeness, and fully convey the scope of the disclosed technology to the skilled person.

With reference to FIG. 1, a semiconductor device for electric discharge protection will now be described in more detail.

FIG. 1 illustrates a semiconductor device 100. The device 100 includes a substrate 110. The substrate 110 has a p-type doping. For example, the substrate 110 may be a semiconductor substrate and the p-type doping may be obtained by implantation of impurities which may provide extra holes.

In the substrate 110, the device 100 includes a first well 120 and a second well 122. Both the first well 120 and the second well 122 have an n-type doping.

The first well 120 and the second well 122 are arranged spaced apart within a surface layer of the substrate 110. Between the first well 120 and the second well 122, there is arranged a third well 124. The third well 124 has the same doping type as the substrate 110, namely a p-type doping. The amount of doping may, however, differ between the substrate 110 and the third well 124. The first well 120, the second well 122 and the third well 124 may for example be obtained by implanting impurities with suitable properties in the substrate 110.

The first well 120 forms an n-type base. In the first well 120, there is formed an emitter region 130 and a base contact region 132. The emitter region 130 has a p-type doping, and may be obtained, for example, by heavily doping the region of the first well 120 with suitable impurities where the emitter region 130 is to be formed. The base contact region 132 has an n-type doping, and may be obtained in a manner similar to that for the emitter region 130, but with different impurity types. The emitter region 130 and the base contact region 132 are arranged within a surface layer of the first well 120.

In the second well 122, there is formed a region 134 which acts as a contact region for the n-type doped second well 122. The region 134 also has an n-type doping, and in some embodiments, for example, the region 134 has a heavier doping than the second well 122. The region 134 is arranged within a surface layer of the second well 122.

The device 100 also includes a collector region 136. The collector region 136 has a p-type doping. The collector region 136 is arranged at least partly within a surface layer of the third well 124, and it overlaps with both of the first well 120 and the second well 122. The overlap with the first well 120 is denoted $O_1$, and the overlap with the second well 122 is denoted $O_2$. The length of the collector region 136 is denoted L.

It may be envisaged that the emitter region 130, the base contact region 132, the region 134, and the collector region 136 are all heavily doped regions.

Together, the substrate 110, the first well 120, the second well 122, the third well 124, the emitter region 130, the base contact region 132, the region 134 and the collector region 136 form part of a PNP bipolar junction transistor (BJT) with a parasitic SCR.

In the embodiment of the semiconductor device 100 illustrated in FIG. 1, a first connection 140 is formed between the emitter region 130 and the base contact region 132. The first connection 140 is, for example, a metallic path, and the first connection 140 includes a biasing resistance 141. The resistance 141 may, for example, be a 10 kΩ resistor, although it is also envisaged that other resistance values may be used. The resistance may, for example, regulate the amount of current flow to/from the base (i.e., the first well 120) via the base contact region 132, such that the PNP with the parasitic SCR is in an off-state during normal operation of, e.g., an integrated circuit to which the semiconductor device 100 may be connected.

In the embodiment of the semiconductor device 100 illustrated in FIG. 1, a second connection 142 is formed between the collector region 136 and the second well 122 (via the region 134). During operation, the semiconductor device may function as an ESD clamp. The second connection 142 may, for example, be further connected to ground, and the first connection 140 may, for example, be further connected to a power rail of an integrated circuit, or to an input/output terminal of such a circuit.

In the embodiment of the semiconductor device 100 illustrated in FIG. 1, and in other embodiments of semiconductor devices according to the disclosed technology, the regions (such as emitter, base contact, and collector regions) may, for example, be separated by an insulating material, such as, for example, an oxide material (not illustrated in the Figures). It may also be envisaged that the regions may be separated, if required, by, e.g., one or more control terminals overlying the substrate or, e.g., a region with an insulating material therebetween. Other examples of separating one or more of the regions described herein may include one or more field-oxides or poly-silicon gates, etc. In other embodiments, no additional separation materials/means may be provided. Instead, background doping of the respective wells may serve to separate the regions. This may assume the absence of for example silicide shorting the regions. It may also be envisaged that, e.g., shallow trench isolation (STI) is used to separate different regions, wells and other structures of semiconductor devices, if or where necessary.

Figures 2, 3:
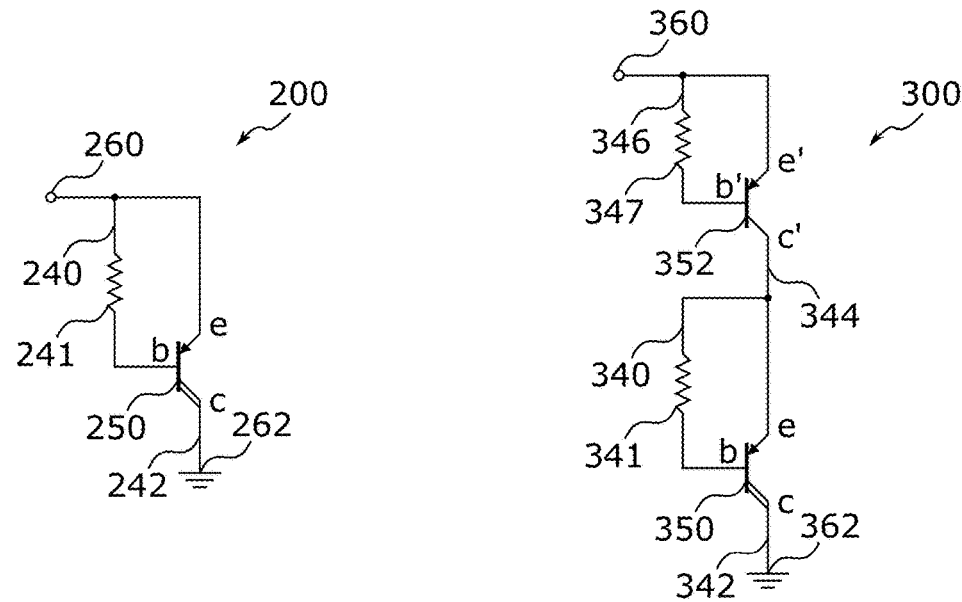
FIG. 2 illustrates schematically an equivalent circuit diagram of an embodiment of a semiconductor device according to the disclosed technology.
FIG. 3 illustrates schematically an equivalent circuit diagram of an embodiment of a semiconductor device according to the disclosed technology.

FIG. 2 illustrates schematically a circuit diagram of a semiconductor device 200 according to the disclosed technology. The device 200 may, for example, be similar or equal to the device 100 described with reference to FIG. 1.

The PNP (BJT) 250 has an emitter e, a base b and a collector c, which may correspond for example to the emitter region 130, the base (first well 120) via the base contact region 132, and the collector region 136 (or the second well 124 via the collector region 136, depending on e.g. the overlap $O_1$ as described herein), respectively, of the device 100 described with reference to FIG. 1. The double-line drawn at the collector c indicates the presence of the parasitic SCR. A first connection 240 connects the base b and the emitter e of the PNP 250, via a biasing resistance 241. The first connection 240 is further connected to a terminal 260. A second connection 242 connects the collector c of the PNP 250 to a ground terminal 262.

With reference to FIG. 3, a further embodiment of a semiconductor device for electric static discharge protection according to the disclosed technology will now be described in more detail.

FIG. 3 illustrates, schematically, a circuit diagram of a semiconductor device 300. The device 300 includes a first PNP (with a parasitic SCR) 350. The first PNP (with the parasitic SCR) 350 may for example correspond to the device 100 or 200 described with reference to FIG. 1 or FIG. 2, respectively. A first connection 340 is formed between the base b and the emitter e of the first PNP 350. The first connection 340 includes a biasing resistor 341. A second connection 342 connects the collector of the first PNP 350 to a ground terminal 362.

In addition, the device 300 includes a second PNP 352 connected in series with the first PNP (with the parasitic SCR) 350. The second PNP 352 has a base b', an emitter e' and a collector c', and a third connection 344 connects the emitter e of the first PNP 350 with the collector c' of the second PNP 352. A fourth connection 346 connects the base b' of the second PNP 352 and the emitter e' of the second PNP 352. The fourth connection 346 includes a biasing resistor 347. The emitter e' of the second PNP 352 is connected to a terminal 360.

The series connected second PNP 352, as described earlier herein, allows to increase a trigger voltage and a holding voltage of the device 300. This may for example provide an improved adaptability to different design windows in terms of ESD protection design.

Figure 4:
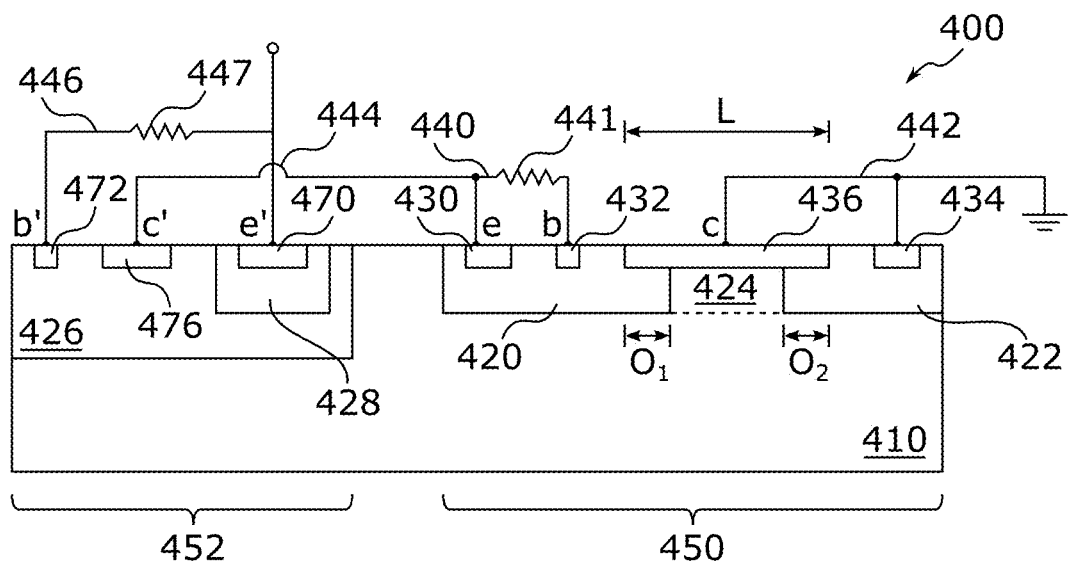
FIG. 4 illustrates schematically an embodiment of a semiconductor device according to the disclosed technology.

FIG. 4 illustrates schematically an embodiment of a semiconductor device 400 for electric (static) discharge protection according to the disclosed technology. The device 400 may, for example, correspond to the device 300 drawn as a circuit diagram in FIG. 3.

The device 400 has a substrate 410, and a first well 420, a second well 422 and a third well 424 arranged within a surface layer of the substrate 410. The first well 420 serves as a base. An emitter region 430 and a base contact region 432 are arranged within a surface layer of the first well 420. A region 434 is arranged within a surface layer of the second well 422. A collector region 436 is arranged at least partly within a surface layer of the third well 124. The collector region 436 overlaps both of the first well 420 and the second well 422. As described earlier herein, depending on, e.g., the overlap $O_1$, the third well 424 may also serve as the collector, with the collector region 436 then serving as a collector contact region.

The doping types and arrangements of the substrate 410, wells 420-424 and regions 430-436 may be equal to those described with reference to FIG. 1. Together, the substrate 410, the first well 420, the second well 422, the third well 424, the emitter region 430, the base contact region 432, the region 434, and the collector region 436 form part of a first BJT (a PNP with a parasitic SCR) 450. The first BJT 450 may, for example, correspond to the first PNP 350 as described with reference to FIG. 3.

The device 400 also includes a fourth well 426. The fourth well 426 has an n-type doping. The fourth well 426 is arranged spaced apart from the first well 420, the second well 424, and the third well 426, within the surface layer of the substrate 410.

A fifth well 428 is arranged within a surface layer of the fourth well 426. The fifth well 428 has a p-type doping. The fifth well 428 may serve as an emitter.

The device 400 includes an emitter contact region 470. The emitter contact region 470 has a p-type doping and is arranged within a surface layer of the fifth well 428. The emitter contact region 470 contacts the (emitter) fifth well 428.

The device 400 includes a base contact region 472. The base contact region 472 has an n-type doping and is arranged within the surface layer of the fourth well 426. The base contact region 472 contacts the (base) fourth well 426.

The device 400 also includes a collector region 476. The collector region 476 has a p-type doping and is arranged within the surface layer of the fourth well 426.

Together, the substrate 410, the fourth well 426, the fifth well 428, the emitter contact region 470, the base contact region 472, and the collector region 476 form part of a second BJT (PNP) 452. The second BJT 452 may, for example, correspond to the second PNP 352 as described with reference to FIG. 3. The fifth well 428 via the emitter contact region 470 may correspond to the emitter e' of the second PNP 352 in FIG. 3. The fourth well via the base contact region 472 may correspond to the base b' of the second PNP 352 in FIG. 3. The collector region 476 may correspond to the collector c' of the second PNP 352 in FIG. 3.

In the embodiment of the device 400 illustrated in FIG. 4, there is provided a third connection 444 which electrically connects the collector region 476 and the emitter contact region 430. There is also provided a fourth connection 446 which electrically connects the base contact region 472 with the emitter contact region 470. The fourth connection 446 includes a biasing resistor 447. The biasing resistor 447 may, for example, be a 10 kΩ resistor, although it may also be envisaged to use other resistor values.

It may be envisaged that a spacing between the collector region 476 and the emitter contact region 470 may influence the holding voltage and the trigger voltage of the device 400. For example, it may be envisaged that an increase in such spacing may increase both the holding voltage and the trigger voltage.

Figure 5:
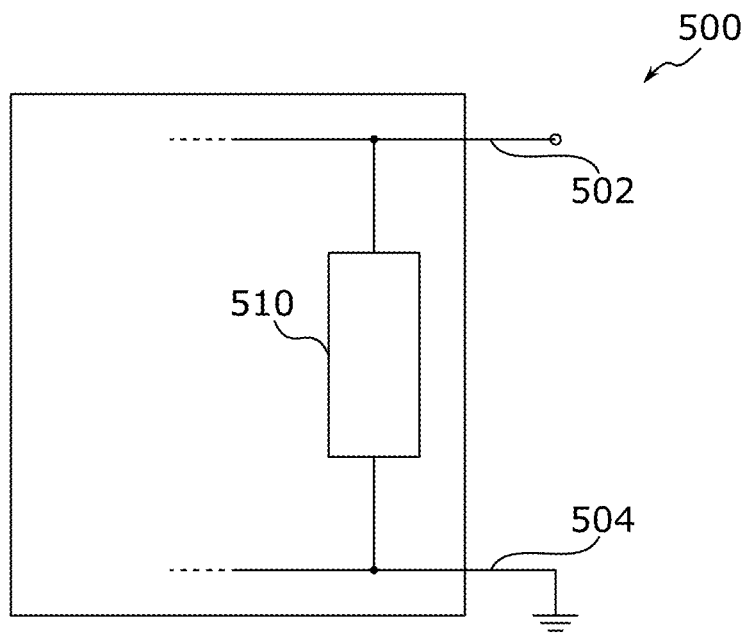
FIG. 5 illustrates schematically an embodiment of an integrated circuit according to the disclosed technology.

With reference to FIG. 5, an integrated circuit according to the disclosed technology will now be described in more detail.

FIG. 5 illustrates schematically an integrated circuit 500 which includes a supply voltage or input/output terminal 502, and a reference voltage terminal 504. The supply voltage terminal 502, if available, and the reference voltage terminal 504 may, for example, be used to power the integrated circuit 500. The input/output terminal 502, if available, and the reference voltage terminal 504 may, for example, be used to provide a signal to/from the integrated circuit 510. The terminal 502 may be an input only, an output only, or both an input/output terminal. The integrated circuit 500 also includes a semiconductor device 510. The semiconductor device 510 is connected between the supply voltage or input/output terminal 502 and the reference voltage terminal 504. The semiconductor device 510 may, for example, be the semiconductor device 100 or 200 described earlier herein with reference to FIG. 1 or 2, respectively, or any other semiconductor device in accordance with the disclosed technology. The semiconductor device 510 may instead, for example, be the semiconductor device 300 or 400 described earlier herein with reference to FIG. 3 or 4, respectively. As described herein, the semiconductor device 510 may function as an ESD clamp, protecting the internal components and structures of the integrated circuit 500 towards for example ESD stress and surges.

Figure 6A:
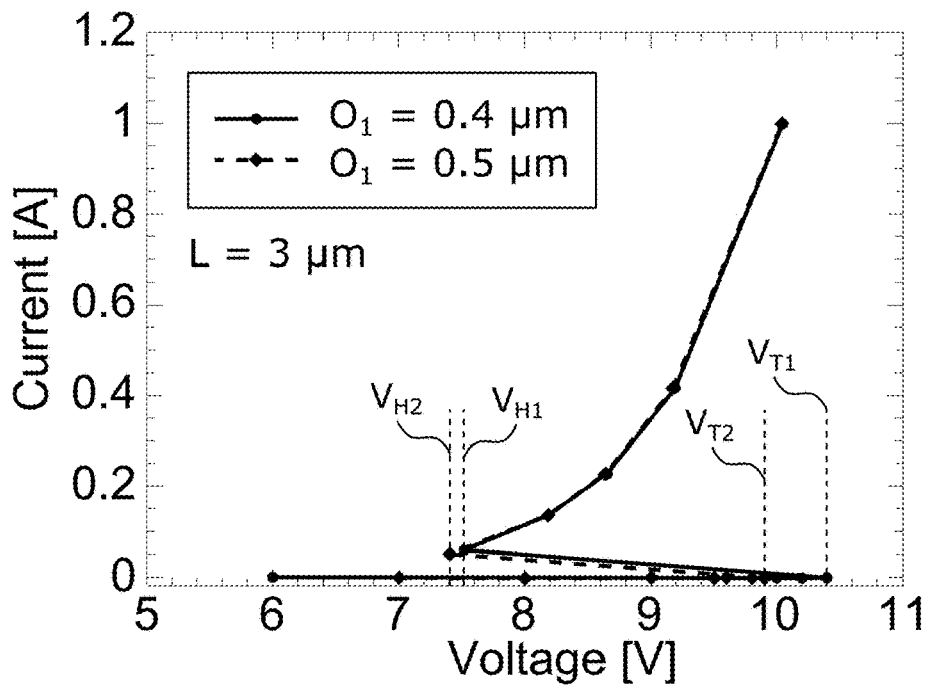
FIGS. 6a and 6b illustrate behaviors of embodiments of semiconductor devices according to the disclosed technology.
Figure 6B:
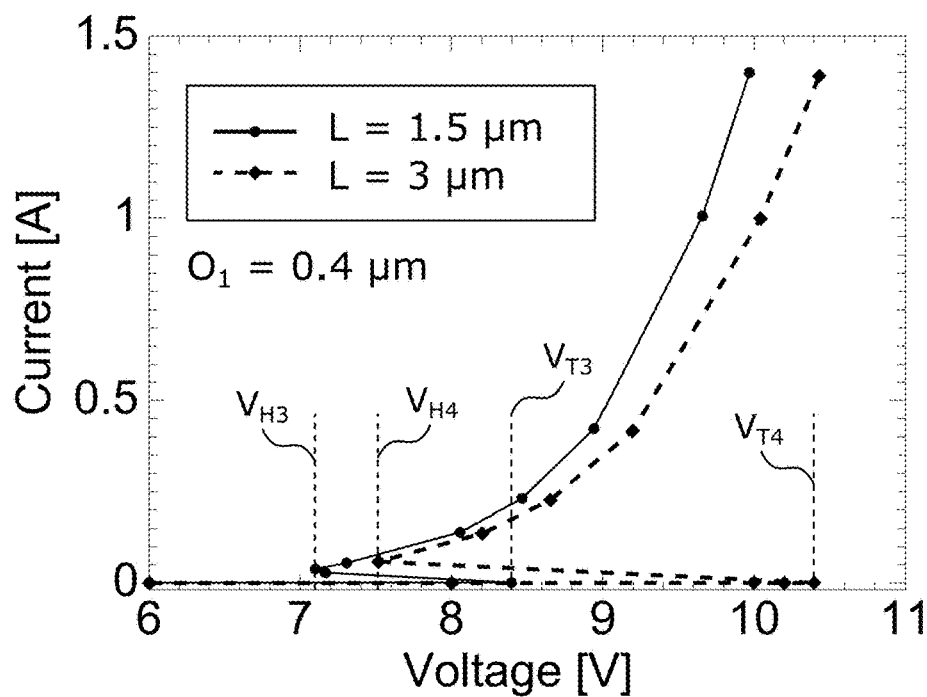

With reference to FIGS. 6a and 6b, behavior of embodiments of a semiconducting device according to the disclosed technology will now be described in more detail.

FIG. 6a illustrates a plot of current as a function of voltage through the semiconducting device for different overlap distances $O_1$. The length of the collector region is kept fixed at L=3 μm. At a first overlap distance of $O_1$=0.4 μm (solid curve in FIG. 6a), a first holding voltage $V_{H1}$ is approximately 7.55 V. At the first overlap distance, a first trigger voltage $V_{T1}$ is approximately 10.4 V. At a second overlap distance of $O_1$=0.5 μm (dashed curve in FIG. 6a), a second holding voltage $V_{H2}$ is approximately 7.4 V. At the second overlap distance, a second trigger voltage $V_{T2}$ is approximately 9.9 V. As may be seen from FIG. 6a, a lowered overlap distance may provide an increased trigger voltage. As may also be seen from FIG. 6a, a lowered overlap distance may provide a minor change in trigger voltage.

FIG. 6b illustrates a plot of current as a function of voltage through the semiconducting device for different lengths L of the collection region. The overlap distance is kept fixed at of $O_1$=0.4 μm. At a first length L=1.5 μm, a third holding voltage $V_{H3}$ is approximately 7.1 V. At the first length, a third trigger voltage $V_{T3}$ is approximately 8.4 V. At a second length L=3 μm, a fourth holding voltage $V_{H4}$ is approximately 7.55 V. At the second length, a fourth trigger voltage $V_{T4}$ is approximately 10.4 V. As may be seen from FIG. 6b, an increased length of the collector region may provide an increase of the trigger voltage. As may also been see from FIG. 6b, an increased length may provide a slight increase of the holding voltage.

The semiconductor device according to the disclosed technology may be manufactured using for example a 20, 28, or 40 nm CMOS process, or similar. Although having been described herein in terms of BJTs, the transistor structures formed within the semiconductor device according to the disclosed technology may also be represented using, e.g., other forms of transistors. The main feature of the disclosed technology is the collector region (or equivalent in a structure of different transistor types) and its overlap with both of the first and second well. As described earlier herein, such an overlap may move the location of the triggering of the transistor containing the SCR, from, for example, between an n-type well and a p-type well, to the collector region. This may allow for a more tunable ESD clamp in terms of trigger and/or holding voltage. The device (the ESD clamp) may be easily adapted to different design windows only by changing the layout, and without other substantial changes (such as changed doping level configurations) to the foundry process. As no special or sensitive trigger circuits are used, the clamp may also be safely used together with e.g. off-chip components and for different ESD stress sources. The semiconductor device according to the disclosed technology may for example enable an implementation of an ESD protection clamp for high-voltage tolerant IC pins in low-voltage CMOS technologies, and the holding and trigger voltage may be changed by changing the layout of the ESD clamp (e.g., the overlap and/or length of the collector region).

The person skilled in the art realizes that the disclosed technology is by no means limited to the embodiments described above. On the contrary, many modifications and variations are possible within the scope of the appended claims.

Although features and elements are described above in particular combinations, each feature or element may be used alone without the other features and elements or in various combinations with or without other features and elements.

Additionally, variations to the disclosed embodiments can be understood and effected by the skilled person in practicing the claimed invention, from a study of the drawings, the disclosure, and the appended claims. In the claims, the word "comprising" does not exclude other elements, and the indefinite article "a" or "an" does not exclude a plurality. The mere fact that certain features are recited in mutually different dependent claims does not indicate that a combination of these features cannot be used to advantage.

What is claimed is:

1. A semiconductor device for electrostatic discharge protection, comprising:
   a substrate having a p-type doping;
   a first well and a second well, both having an n-type doping and arranged spaced apart within a surface layer of the substrate;
   a third well having a p-type doping and arranged within the surface layer of the substrate between the first well and the second well;

an emitter region having a p-type doping and arranged within a surface layer of the first well;
a base contact region having an n-type doping and arranged within the surface layer of the first well; and
a collector region having a p-type doping;
wherein the emitter region, the base contact region and the collector region form part of a first bipolar junction transistor, BJT, and
wherein the collector region is arranged at least partly within a surface layer of the third well and such that it overlaps both of the first well and the second well.

2. The device according to claim 1, wherein the emitter region, the base contact region, and the collector region are heavily doped regions.

3. The device according to claim 1, further comprising:
a first connection electrically connecting the emitter region and the base contact region of the BJT together, and
a second connection electrically connecting the second well and the collector region of the BJT together.

4. The device according to claim 3, wherein the first connection includes a biasing resistance.

5. The device according to claim 3, wherein the second connection includes an n-type region having a heavy n-type doping and arranged within a surface layer of the second well.

6. The device according to claim 5, wherein the first connection includes a biasing resistance.

7. The device according to claim 1, wherein the BJT is a first BJT, the device further comprising a second BJT formed in the substrate and spaced apart from both of the first well, the second well and the third well, wherein a base of the second BJT has an n-type doping, and wherein the device further comprises:
a third connection electrically connecting a collector of the second BJT and the emitter region of the first BJT together, and
a fourth connection electrically connecting the base of the second BJT and an emitter of the second BJT together.

8. The device according to claim 7, wherein the fourth connection includes a biasing resistance.

9. The device according to claim 8, wherein the second BJT comprises:
a fourth well having an n-type doping and arranged spaced apart from the first well, the second well, and the third well within the surface layer of the substrate;
a fifth well having a p-type doping and arranged within a surface layer of the fourth well;
a base contact region having an n-type doping and being arranged within the surface layer of the fourth well;
a collector region having a p-type doping and being arranged within the surface layer of the fourth well, and
an emitter contact region having a p-type doping and being arranged within a surface layer of the fifth well.

10. The device according to claim 2, further comprising:
a first connection electrically connecting the emitter region and the base contact region of the BJT together, and
a second connection electrically connecting the second well and the collector region of the BJT together.

11. The device according to claim 10, wherein the first connection includes a biasing resistance.

12. The device according to claim 10, wherein the second connection includes an n-type region having a heavy n-type doping and arranged within a surface layer of the second well.

13. The device according to claim 12, wherein the first connection includes a biasing resistance.

14. The device according to claim 10, wherein the BJT is a first BJT, the device further comprising a second BJT formed in the substrate and spaced apart from both of the first well, the second well and the third well, wherein a base of the second BJT has an n-type doping, and wherein the device further comprises:
a third connection electrically connecting a collector of the second BJT and the emitter region of the first BJT together, and
a fourth connection electrically connecting the base of the second BJT and an emitter of the second BJT together.

15. The device according to claim 14, wherein the fourth connection includes a biasing resistance.

16. The device according to claim 15, wherein the second BJT comprises:
a fourth well having an n-type doping and arranged spaced apart from the first well, the second well, and the third well within the surface layer of the substrate;
a fifth well having a p-type doping and arranged within a surface layer of the fourth well;
a base contact region having an n-type doping and being arranged within the surface layer of the fourth well;
a collector region having a p-type doping and being arranged within the surface layer of the fourth well, and
an emitter contact region having a p-type doping and being arranged within a surface layer of the fifth well.

17. The device according to claim 3, wherein the BJT is a first BJT, the device further comprising a second BJT formed in the substrate and spaced apart from both of the first well, the second well and the third well, wherein a base of the second BJT has an n-type doping, and wherein the device further comprises:
a third connection electrically connecting a collector of the second BJT and the emitter region of the first BJT together, and
a fourth connection electrically connecting the base of the second BJT and an emitter of the second BJT together.

18. The device according to claim 17, wherein the fourth connection includes a biasing resistance.

19. An integrated circuit comprising a semiconductor device according to claim 1, comprising a supply voltage or input/output terminal and a reference voltage terminal, wherein the reference voltage terminal is electrically connected to the second well and the collector region of the BJT, and wherein the supply voltage or input/output terminal is electrically connected to the emitter region of the BJT.

20. An integrated circuit comprising a semiconductor device according to claim 6, comprising a supply voltage or input/output terminal and a reference voltage terminal, wherein the reference voltage terminal is electrically connected to the second well and the collector region of the BJT, and wherein the supply voltage or input/output terminal is electrically connected to the emitter contact region of the second BJT.

* * * * *